(12) United States Patent
Morishita

(10) Patent No.: US 7,339,771 B2
(45) Date of Patent: Mar. 4, 2008

(54) ELECTROSTATIC PROTECTION CIRCUIT

(75) Inventor: Yasuyuki Morishita, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 224 days.

(21) Appl. No.: 11/108,854

(22) Filed: Apr. 19, 2005

(65) Prior Publication Data
US 2005/0231867 A1 Oct. 20, 2005

(30) Foreign Application Priority Data
Apr. 20, 2004 (JP) ............................. 2004-124731

(51) Int. Cl.
*H02H 9/00* (2006.01)
(52) U.S. Cl. ...................................... 361/56
(58) Field of Classification Search .................. 361/56
See application file for complete search history.

(56) References Cited

U.S. PATENT DOCUMENTS

| | | | | |
|---|---|---|---|---|
| 5,719,737 A | * | 2/1998 | Maloney | ..................... 361/111 |
| 5,932,918 A | | 8/1999 | Krakauer | |
| 6,556,398 B1 | * | 4/2003 | Chen | ........................... 361/56 |
| 2004/0141270 A1 | * | 7/2004 | Kaneki | ........................ 361/56 |
| 2005/0213271 A1 | * | 9/2005 | Chong et al. | ................. 361/56 |
| 2006/0056121 A1 | * | 3/2006 | Esmark et al. | ................ 361/56 |

FOREIGN PATENT DOCUMENTS

JP 8-222643 8/1996

OTHER PUBLICATIONS

Warrent R. Anderson, et al., "ESD Protection for Mixed-Voltage I/O Using NMOS Transistors Stacked in a Cascode Configuration", EOS/ESD Symposium 98-54.
Japanese Office Action dated Apr. 18, 2006 and partial English Translation.

* cited by examiner

*Primary Examiner*—Ronald W. Leja
(74) *Attorney, Agent, or Firm*—McGinn IP Law Group, LLC

(57) ABSTRACT

An electrostatic protection circuit to prevent damage to a protected circuit due to electrostatic discharge applied to an input/output terminal, comprises one or more diodes connected in series and provided between a connection point of the input/output terminal and the protected circuit, and a GND terminal and a MOS transistor connected to the diodes in series, and having an operating voltage lower than a signal voltage input from the input/output terminal. The diodes cause a voltage drop in normal operation.

17 Claims, 5 Drawing Sheets

ELECTROSTATIC PROTECTION CIRCUIT

BACKGROUND OF THE INVENTION

1. Field of the Invention

This invention relates to an electrostatic protection circuit to prevent damage to a protected circuit due to electrostatic discharge applied to an input/output terminal.

2. Description of the Related Art

In association with reduction in circuit voltages, differences in operating voltage may occur between internal circuits, such as logic circuits, and interface circuits exchanging signals with other circuits. For example, while internal circuits operate on a signal voltage of 1.5V, interface circuits operate on signal voltages of 3.3V and 2.5V. In interface circuits, in order to operate at a signal voltage higher than that of the internal circuit, the thickness of the oxide film on the gates of the Metal Oxide Semiconductor (MOS) transistors provided within the circuits is normally made thicker in the interface circuits than in the internal circuits. A plurality of oxide processes are required to achieve this, and the manufacturing process becomes complex, and costs increase.

On the other hand, electrostatic protection circuits are normally provided to prevent damage to internal circuits due to electrostatic discharge (ESD) occurring in semiconductor integrated circuits when manufacturing LSIs and mounting LSIs on boards. These electrostatic protection circuits are a type of interface circuit, and may operate at a higher signal voltage than the internal circuit.

FIG. 5 shows an example of the configuration of a conventional electrostatic protection circuit. FIG. 5A is an example in which an electrostatic protection circuit is comprised of a single N channel MOS transistor 301. As shown in the figure, the drain of the N channel MOS transistor 301 is connected to the connection point of the input pad (input terminal) 1 and internal circuit 50. The N channel MOS transistor 301 gate and source are both connected to the GND terminal. From the point of view of reliability of the MOS transistor, a signal voltage higher than the operating voltage of the MOS transistor can generally not be input in this electrostatic protection circuit. For example, when the operating voltage of the MOS transistor is 3.3V, and a 5.0V signal is input, a potential difference of 5.0V occurs between the drain and gate of the N channel MOS transistor 301, and the gate oxide film is stressed to a voltage of 5.0V. When the operating voltage of the MOS transistor is 3.3V, the gate oxide film is also compatible with 3.3V, and stressing to a voltage of 5.0V will result in a dramatic loss of reliability.

The electrostatic protection circuit shown in FIG. 5B is therefore generally employed when a signal voltage higher than the operating voltage of the MOS transistor is input. In the electrostatic protection circuit shown in FIG. 5B, the N channel MOS transistors 302 and 303 are connected in cascode configuration. The drain of the N channel MOS transistor 302 is connected to the connection point of the input pad 1 and internal circuit 50, the gate is connected to the power supply terminal (for example, 3.3V power supply), and the source is connected to the drain of the N channel MOS transistor 303. Furthermore, the gate and source of the N channel MOS transistor 303 are both connected to the GND terminal.

In this electrostatic protection circuit, even if the operating voltage of the N channel MOS transistors 302 and 303 is 3.3V, a 5.0V signal input is possible. When a 5.0V signal is input to signal pad 1, the voltage stress applied to the oxide film of the gate of the N channel MOS transistor 302 is 5.0V−3.3V=1.7V. Even when the signal voltage input to the signal pad 1 varies between 0V and 5.0V, the electric potential between the drain and gate of the N channel MOS transistor 302 does not exceed 3.3V. Furthermore, the drain voltage of the N channel MOS transistor 303 is a maximum of 3.3V−Vt (Vt being the threshold voltage of the N channel MOS transistor 302), and the electric potential between the drain and gate of the N channel MOS transistor 303 does not exceed 3.3V. Thus, in the electrostatic protection circuit shown in FIG. 5B, reliability is not lost even if a signal voltage higher than the MOS transistor operating voltage is input.

However, in the circuit shown in FIG. 5B, a problem exists in relation to discharge capacity. This point is described in reference to FIG. 6. FIG. 6A is a cross-sectional diagram showing the structure of the circuit example shown in FIG. 5A. FIG. 6B is a cross-sectional diagram showing the structure of the circuit example shown in FIG. 5B.

When ESD stress is applied to these circuits, current flows to the GND terminal due to NPN bipolar operation. The shorter the distance L between the $N^+$ diffusion layers, therefore, the better the bipolar performance, and the greater the discharge capacity. Since the distance L shown in FIG. 6B is naturally longer that the distance L shown in FIG. 6A for reasons of structure, bipolar performance is low, and discharge capacity is inevitably reduced. In 3.3V transistors using 0.15 μm CMOS technology, for example, the distance L is 0.1 μm or greater. Thus, in the circuit shown in FIG. 5B having the structure shown in FIG. 6B, the dimension W in the depth direction of the page in FIG. 6B must be increased.

However, increasing the dimension W increases the parasitic capacitance C, and results in a loss in clarity of the signal input to the input pad 1, thus introducing a problem in that high-speed operation is prevented. When the distance L in FIG. 6B is equal to or greater than 1.0 μm, parasitic capacitance C becomes 2 pF or greater in order to ensure the prescribed ESD resistance (for example, a resistance of 2000V or greater in tests using the Human Body Model). At this parasitic capacitance, high-speed operation (GHz band) is impossible.

Occurrence of the same problem is noted in the electrostatic protection circuit disclosed in U.S. Pat. No. 5,932,918 and in 'ESD Protection for Mixed Voltage I/O Using NMOS Transistors Stacked in Cascode Configuration', Warren R. Anderson and David B. Krakauer, EOS/ESD Symposium 98-54.

As described above, in the conventional electrostatic protection circuit shown in FIG. 5A, there was a problem in that reliability was lost when a signal voltage higher than the operating voltage of the internal circuit was input. Furthermore, as shown in FIG. 5B, there was a problem in the conventional electrostatic protection circuit in that both a high ESD resistance and a low parasitic capacitance compatible with high-speed circuit operation could not be obtained simultaneously.

SUMMARY OF THE INVENTION

According to one aspect of the present invention, there is provided an electrostatic protection circuit to prevent damage to a protected circuit due to electrostatic discharge applied to an input/output terminal, comprising one or more diodes connected in series and provided between a connection point of the input/output terminal and the protected circuit, and a GND terminal and a MOS transistor connected to the diodes in series, and having an operating voltage lower than a signal voltage input from the input/output terminal, wherein the diodes cause a voltage drop in normal operation.

According to another aspect of the present invention, there is provided an electrostatic protection circuit to prevent damage to a protected circuit due to electrostatic discharge applied to an input/output terminal, comprising one or more diodes connected in series and an N channel MOS transistor of which drain is connected to the cathode of one end of the diodes, of which source is connected to a GND terminal, and which has an operating voltage less than a signal voltage input from the input/output terminal, wherein the anode of the other end of the diodes, is connected to a connection point of the input/output terminal and the protected circuit and wherein the diodes cause a voltage drop in normal operation.

According to another aspect of the present invention, there is provided an electrostatic protection circuit to prevent damage to a protected circuit due to electrostatic discharge applied to an input/output terminal, comprising a P channel MOS transistor of which source is connected to a connection point of the input/output terminal and the protected circuit and one or more diodes connected in series, wherein the anode of the end of the diodes, is connected to the drain of the P channel MOS transistor, and the cathode of the other end of the diodes is connected to the GND terminal, and wherein the diodes cause a voltage drop in normal operation.

According to the present invention, an electrostatic protection circuit is provided in which reliability is not lost even when a signal voltage higher than the operating voltage of the internal circuit is input, and both a high ESD resistance and a low parasitic capacitance compatible with high-speed circuit operation can be obtained simultaneously.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
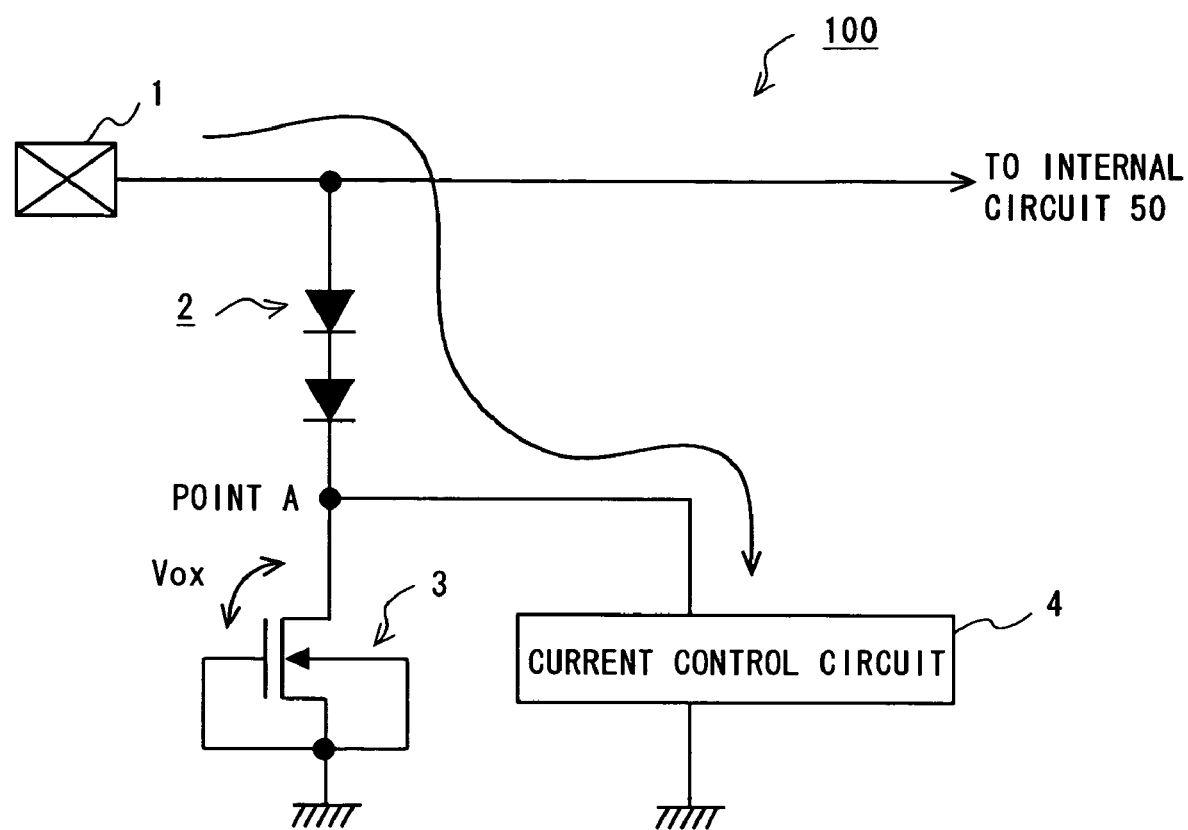
FIG. 1 shows a circuit block diagram of the electrostatic protection circuit according to the present invention.

The electrostatic protection circuit according to the first embodiment of the present invention is shown in FIG. 1. As shown in the figure, the input pad (input terminal) 1 is connected to the internal circuit 50, and the electrostatic protection circuit 100 is provided at the connection point. The electrostatic protection circuit may be provided at the connection point of the output pad (output terminal) and the internal circuit in some cases. The input terminal and/or the output terminal are I/O terminals in this specification.

The electrostatic protection circuit 100 comprises a plurality of diodes 2 and an N channel MOS transistor 3 in series, the diodes 2 being provided close to the connection point of the input pad 1 and the internal circuit 50. Two diodes are connected in series as the diode 2. The anode of the diode at the connection point of the input pad 1 and the internal circuit 50 is connected to the connection point, and the cathode of the diode close to the N channel MOS transistor is connected to the drain of the N channel MOS transistor 3.

The source and gate of the N channel MOS transistor 3 are connected to the GND terminal. This N channel MOS transistor 3 operates at a voltage (power supply voltage) less than the signal voltage and similar to that of the internal circuit 50. For example, when the transistor in the internal circuit 50 operates at 3.3V, the N channel MOS transistor 3 also operates at 3.3V, and therefore, the transistor in the internal circuit 50 and the transistor in the electrostatic protection circuit 100 can be manufactured with the same process, eliminating the need to manufacture two or more types of gate oxide film.

Since the N channel MOS transistor 3 operates at a voltage less than the signal voltage input from the input pad 1, the signal voltage is dropped by the diode 2. Thus, input and output of a signal voltage higher than the operating voltage (power supply voltage) is possible without applying excess voltage (Vox) between the drain and gate of the N channel MOS transistor 3. In other words, since a voltage drop occurs due to the diode 2, the voltage between the drain and source of the N channel MOS transistor 3 is less than the signal voltage.

A current control circuit 4 is provided between the connection point A between the diode 2 and the N channel MOS transistor 3, and the GND terminal. Specifically, the current control circuit 4 is provided in parallel to the N channel MOS transistor 3. By adjusting the current flowing in this current control circuit 4 and the number of series connections in the diode 2, the voltage drop due to the diode 2 can be set as desired. In other words, the electric potential at point A can be set as desired.

In the embodiments of the present invention, the diode 2 is comprised of two diodes connected in series, however, as described above, the number of diodes is required to be adjusted to obtain the prescribed value for electric potential at point A. However, as the number of diodes connected in series increases, excess voltage is developed when ESD current flows due to the effects of the parasitic resistance component, and the internal circuit is readily damaged by voltage. It is therefore desirable that the number of diodes be minimized in consideration of signal voltage in normal operation, and resistance of the internal circuit to voltage damage. In the embodiments of the present invention, therefore, the number of diodes is restricted, and the current control circuit 4 provided to ensure a voltage drop across the diode 2 in normal operation.

Figure 2A:
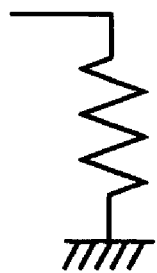
FIG. 2A to 2C show a circuit block diagram of the current control circuit according to the present invention.
Figure 2B:
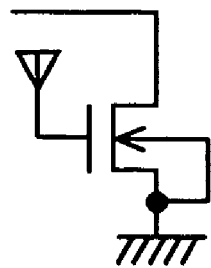
Figure 2C:
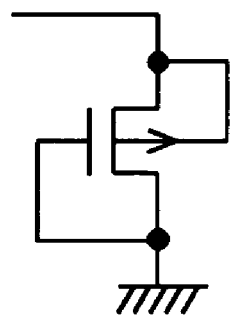

A configuration example of the current control circuit 4 is shown in FIG. 2. As shown in FIG. 2A, the current control circuit 4 can be fundamentally comprised of a resistor, and as shown in FIG. 2B, it can be comprised of an N channel MOS transistor. In this case, the gate is connected to the power supply, and the source is connected to the GND terminal. Furthermore, as shown in FIG. 2C, the current control circuit 4 can also be comprised of a P channel MOS transistor. In this case, the gate and drain are connected to the GND terminal.

Figure 3:
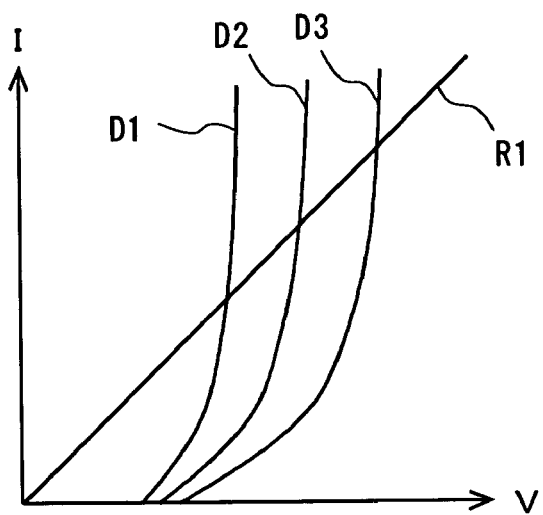
FIG. 3 shows a graph of the current-voltage characteristics.
Figure 4:
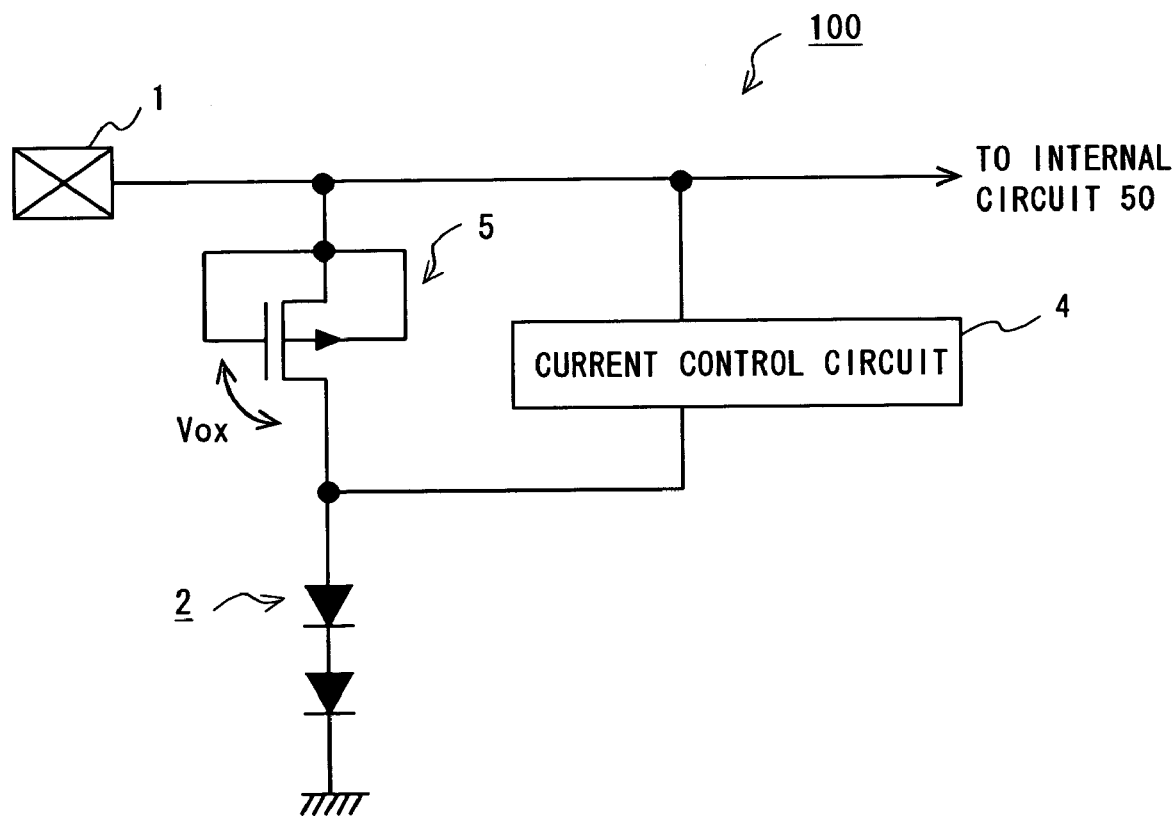
FIG. 4 shows a circuit block diagram of the current control circuit according to the present invention.
Figure 5A:
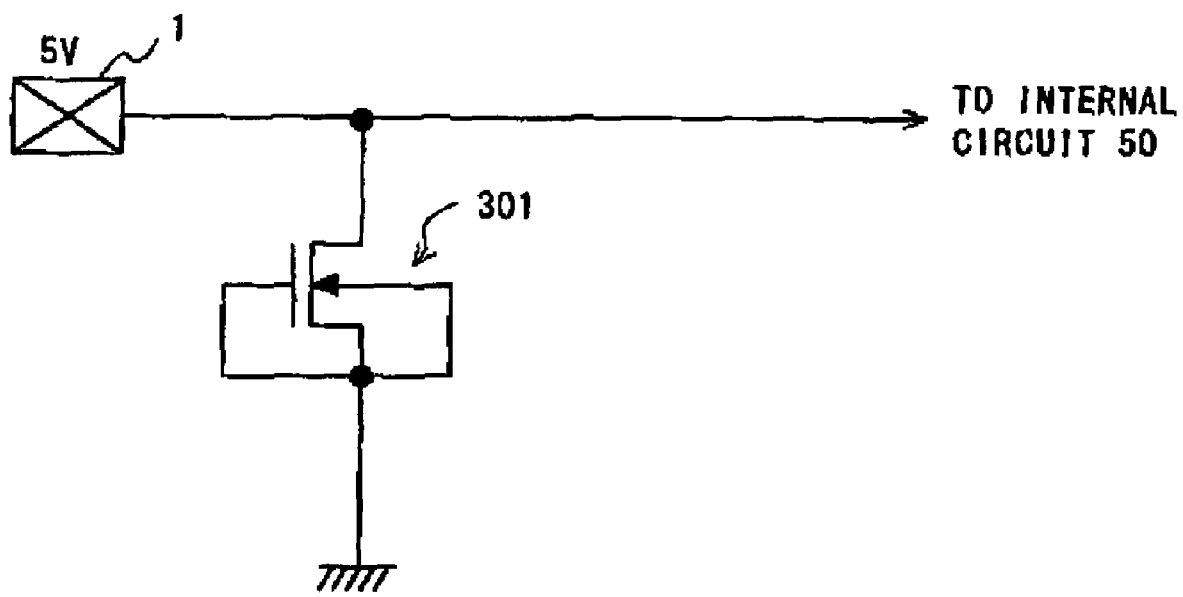
FIGS. 5A and 5B show a circuit block diagram of the conventional current control circuit.
Figure 5B:
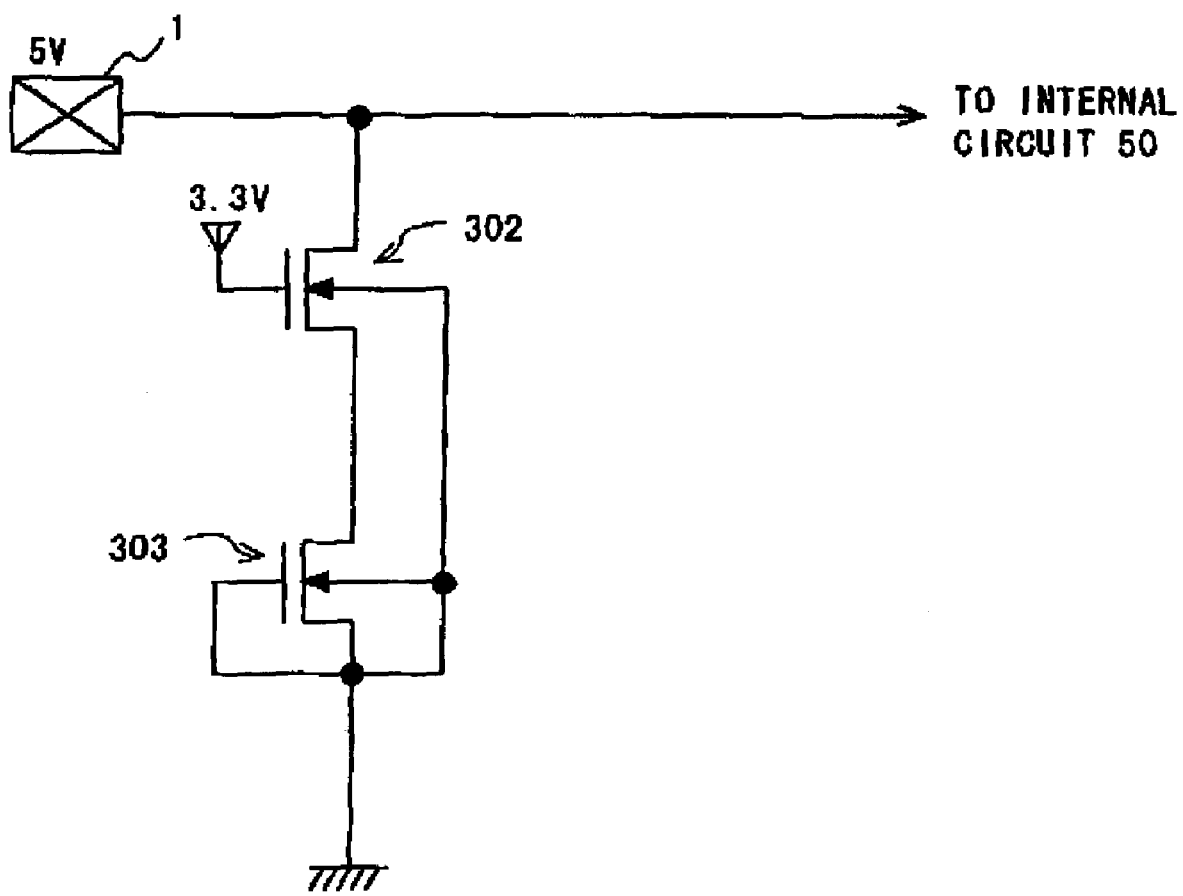
Figure 6A:
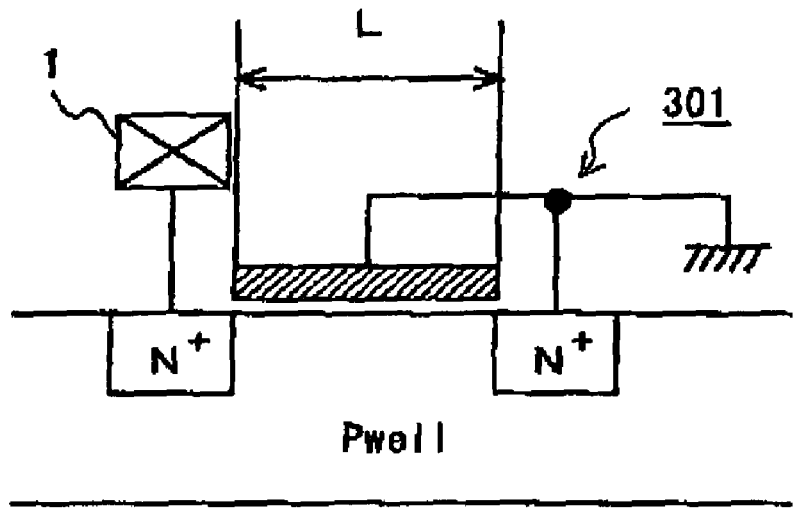
FIGS. 6A and 6B show a circuit block diagram of the conventional current control circuit.
Figure 6B:
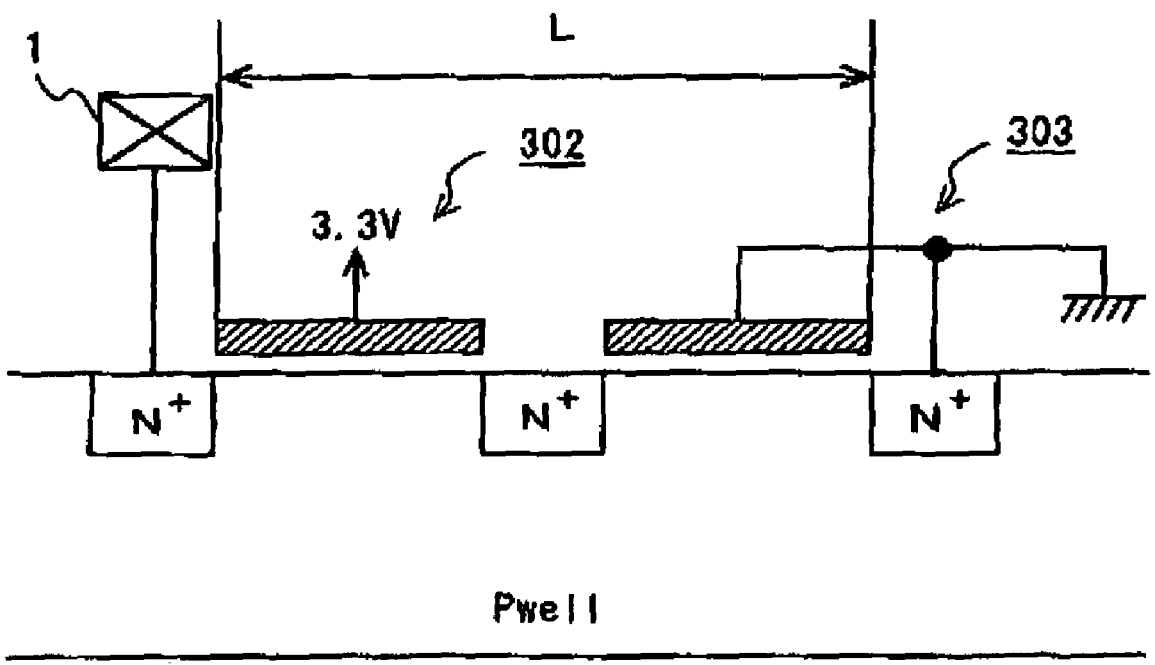

In the first embodiment of the present invention, the signal voltage is dropped using the diode 2, however it is also possible to provide a voltage drop using a resistance in place of the diode 2. However, as shown in the current-voltage characteristics in FIG. 3, while the current flowing in the resistor R1 increases appropriately in direct proportion to the increase in voltage, almost no current flows in the diodes D1, D2, and D3 up to a certain voltage, and when the certain voltage is exceeded, current begins to flow, and then rapidly increases. Thus, the diode can ensure a voltage drop in comparison to the resistor, and allows a ready flow of ESD current at or above the certain voltage, and therefore a diode is employed as a voltage reduction means in the first embodiment of the present invention.

As described above, according to the electrostatic protection circuit 100 of the first embodiment of the present invention, since voltage is dropped with the diode 2, the gate oxide film of the N channel MOS transistor 3 needs only to withstand voltage less than the signal voltage, and can therefore be comprised of a thin gate oxide film. A gate oxide film of the same thickness as that of the internal circuit 50 can therefore be used, and the manufacturing process can be simplified. Furthermore, since the current control circuit 4 is provided in parallel to the N channel MOS transistor 3, the voltage drop due to the diode 2 can be adjusted, and the drain electric potential of the N channel MOS transistor 3 can be set as desired. Since the number of diodes 2 can be reduced, particularly with the current control circuit 4, damage to the internal circuit 50 due to ESD stress can be effectively reduced. According to the present invention, a high ESD resistance (in tests using the Human Body Model) can be obtained at voltages of 2000V or greater at a low parasitic capacitance of 0.5 pF. A low parasitic capacitance is due to the diode 2 and serial placement of the diffusion capacitances of the N channel MOS transistor 3 and reduction of the synthesized capacitance, and high ESD resistance is due to elimination of connection in cascode configuration of N channel MOS transistors, and maximization of bipolar performance.

Second Embodiment

The electrostatic protection circuit 100 according to the second embodiment has a P channel MOS transistor 5. The source and gate of the P channel MOS transistor 5 are connected to the connection point of the input pad 1 and the internal circuit 50, and the drain is connected to the anode of the diode 2 connected in series. The cathode of the diode 2 is connected to the GND terminal.

The current control circuit 4 is provided between the connection point of the input pad 1 and the internal circuit 50, and the connection point A of the P channel MOS transistor 5 and the diode 2. Specifically, the current control circuit 4 is provided in parallel with the P channel MOS transistor 5.

In the electrostatic protection circuit 100 having this configuration, when a signal voltage higher than the operating voltage of the P channel MOS transistor 5 is input, current flows to the diode 2 via the current control circuit 4 connected in parallel to the P channel MOS transistor 5, resulting in a voltage drop across the diode 2. As with the first embodiment of the present invention, the voltage drop across the diode 2 can be set as desired by adjusting the current flowing in the current control circuit 4 and the number of diodes 2. Thus, input and output of signals of a voltage higher than the operating voltage is possible without applying an excess voltage (Vox) between the drain and gate of the P channel MOS transistor 5.

As described above, according to the electrostatic protection circuit 100 of the second embodiment of the present invention, since voltage is dropped with the diode 2, the gate oxide film of the P channel MOS transistor 5 needs only to withstand voltage less than the signal voltage, and can therefore be comprised of a thin gate oxide film. A gate oxide film of the same thickness as that of the internal circuit 50 can therefore be used, and the manufacturing process may be simplified. Furthermore, since the current control circuit 4 is provided in parallel to the P channel MOS transistor 5, the voltage drop due to the diode 2 can be adjusted, and the drain electric potential of the P channel MOS transistor 5 can be set as desired. In the second embodiment of the present invention, a high ESD resistance (in tests using the Human Body Model) can be obtained at voltages of 2000V or greater at a low parasitic capacitance of 0.5 pF.

Other Embodiments

A plurality of N channel MOS transistors 3 and P channel MOS transistors 5 may be connected in parallel in the afore-mentioned electrostatic protection circuits.

It is apparent that the present invention is not limited to the above embodiment and it may be modified and changed without departing from the scope and spirit of the invention.

What is claimed is:

1. An electrostatic protection circuit to prevent damage to a protected circuit due to electrostatic discharge applied to an input/output terminal, comprising:
   one or more diodes connected in series and provided between a connection point of the input/output terminal and the protected circuit, and a ground (GND) terminal;
   a MOS transistor connected to the diodes in series, and having an operating voltage lower than a signal voltage input from the input/output terminal; and
   a current control circuit which is formed at a connection point of the diodes and the MOS transistor and in parallel with the MOS transistor, and controls an electric potential at said connection point of the diodes and the MOS transistor,
   wherein the diodes cause a voltage drop.

2. The electrostatic protection circuit according to claim 1, wherein said MOS transistor is formed between said ground terminal and said diodes.

3. The electrostatic protection circuit according to claim 1, wherein said current control circuit comprises a resistor.

4. The electrostatic protection circuit according to claim 1, wherein said current control circuit comprises an N channel MOS transistor having a gate which is connected to a power supply, and a source which is connected to a ground terminal.

5. The electrostatic protection circuit according to claim 1, wherein said current control circuit comprises a P channel MOS transistor having a gate and drain which are connected to a ground terminal.

6. The electrostatic protection circuit according to claim 1, wherein said MOS transistor includes a gate which is connected to the ground terminal.

7. The electrostatic protection circuit according to claim 1, wherein said protected circuit comprises an MOS transistor with a gate oxide film having a thickness which is no greater than a thickness of a gate oxide film of said MOS transistor connected to said diodes in series.

8. The electrostatic protection circuit according to claim 1, wherein said MOS transistor comprises a plurality of MOS transistors connected in parallel.

9. The electrostatic protection circuit according to claim 1, wherein said voltage drop is such that a voltage between a source and drain of said MOS transistor is less than said signal voltage.

10. The electrostatic protection circuit according to claim 1, wherein the diodes cause said voltage drop in normal operation.

11. An electrostatic protection circuit to prevent damage to a protected circuit due to electrostatic discharge applied to an input/output terminal, comprising:

one or more diodes connected in series;

an N channel MOS transistor including a drain which is connected to the cathode of one end of the diodes, and a source which is connected to a ground terminal, and which has an operating voltage less than a signal voltage input from the input/output terminal; and a current control circuit which is formed at a connection point of the diodes and the MOS transistor and in parallel with the MOS transistor, and controls an electric potential at a connection point of the diodes and the MOS transistor, wherein the anode of the other end of the diodes, is connected to a connection point of the input/output terminal and the protected circuit, and wherein the diodes cause a voltage drop.

12. The electrostatic protection circuit according to claim 11, wherein said current control circuit controls the electric potential of the drain of the N channel MOS transistor.

13. The electrostatic protection circuit according to claim 12, wherein the current control circuit is provided between the connection point of the diodes and the N channel MOS transistor, and the GND terminal.

14. An electrostatic protection circuit to prevent damage to a protected circuit due to electrostatic discharge applied to an input/output terminal, comprising:

a P channel MOS transistor having a source which is connected to a connection point of the input/output terminal and the protected circuit;

one or more diodes connected in series; and a current control circuit which is formed at a connection point of the diodes and the MOS transistor and in parallel with the MOS transistor, and controls an electric potential at said connection point of the diodes and the MOS transistor, wherein the anode of the end of the diodes, is connected to the drain of the P channel MOS transistor, and the cathode of the other end of the diodes is connected to the ground (GND) terminal; and wherein the diodes cause a voltage drop.

15. The electrostatic protection circuit according to claim 14, wherein said current control circuit controls the electric potential of the drain of the P channel MOS transistor.

16. The electrostatic protection circuit according to claim 15, wherein the current control circuit is provided between the connection point of the input/output terminal and the protected circuit, and the connection point of the P channel MOS transistor and the diodes.

17. The electrostatic protection circuit according to claim 14, wherein said MOS transistor includes a gate which is connected to the connection point of the input/output terminal and the protected circuit.

\* \* \* \* \*